(12) United States Patent  
Parat et al.

(10) Patent No.: US 6,265,292 B1
(45) Date of Patent: Jul. 24, 2001

(54) METHOD OF FABRICATION OF A NOVEL FLASH INTEGRATED CIRCUIT

(75) Inventors: Krishna Parat, Palo Alto; Raghupathy V. Giridhar, Sratoga; Cheng C. Hu, San Jose; Daniel Xu, Mountain View; Yudong Kim, Santa Clara; Glen Wada, Fremont, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/351,498

(22) Filed: Jul. 12, 1999

(51) Int. Cl.$^7$ .................................................. H01L 21/425
(52) U.S. Cl. ...................... 438/524; 438/526; 438/700; 438/701; 438/434
(58) Field of Search ...................... 438/238, 435, 438/431, 424, 257, 427, 524, 526, 700, 701, 561, 262, 478, 434; 257/302

(56) References Cited

U.S. PATENT DOCUMENTS

| 4,419,150 | * | 12/1983 | Soclof | 438/337 |
|---|---|---|---|---|
| 5,084,418 | * | 1/1992 | Esquivel et al. | 438/301 |
| 5,210,047 | * | 5/1993 | Woo et al. | 438/257 |
| 5,399,525 | * | 3/1995 | Blanchard | 438/78 |
| 5,573,969 | * | 11/1996 | Kim | 438/224 |
| 5,661,053 | * | 8/1997 | Yuan | 438/257 |
| 5,831,301 | * | 11/1998 | Horak et al. | 257/302 |
| 5,874,346 | * | 2/1999 | Fulford, Jr. et al. | 438/433 |
| 5,879,971 | * | 3/1999 | Witek | 438/238 |
| 5,888,880 | * | 3/1999 | Gardner et al. | 438/424 |
| 5,891,787 | * | 4/1999 | Gardner et al. | 438/424 |
| 5,895,253 | * | 4/1999 | Akram | 438/424 |
| 5,904,541 | * | 5/1999 | Rho et al. | 438/433 |
| 5,937,287 | * | 8/1999 | Gonzalez | 438/220 |
| 5,940,717 | * | 11/1999 | Rengarajan et al. | 438/435 |
| 5,960,276 | * | 9/1999 | Liaw et al. | 438/224 |
| 5,981,357 | * | 11/1999 | Hause et al. | 438/427 |
| 5,989,977 | * | 11/1999 | Wu | 438/431 |
| 5,998,301 | * | 12/1999 | Pham et al. | 438/701 |
| 6,087,214 | * | 7/2000 | Cunningham | 438/244 |

* cited by examiner

*Primary Examiner*—Eddie C. Lee
*Assistant Examiner*—José R. Diaz
(74) *Attorney, Agent, or Firm*—Blakely, Sokoloff, Taylor & Zafman LLP

(57) ABSTRACT

A method of fabricating a flash memory integrated circuit is described. In an embodiment of the present invention a dielectric filled trench isolation region is formed in a silicon substrate. The dielectric filled trench isolation region isolates a first portion of the silicon substrate from a second portion of the silicon substrate. A portion of the dielectric in the trench is then removed to reveal a portion of the silicon substrate in the trench between the first and second portions of the silicon substrate. Ions are then implanted to form a first source region in the first portion of the silicon substrate and to form a second source region in the second portion of the silicon substrate and to form a doped region in the revealed silicon substrate in the trench wherein the doped region in the trench extends from the first doped source region to the second doped source region.

3 Claims, 12 Drawing Sheets

THROUGH S/D IN BITLINE DIRECTION

THROUGH STI IN BITLINE DIRECTION

ALONG BITLINE DIRECTION

ALONG BITLINE DIRECTION

ALONG BITLINE DIRECTION

ALONG BITLINE DIRECTION

ALONG BITLINE DIRECTION

ALONG BITLINE DIRECTION

METHOD OF FABRICATION OF A NOVEL FLASH INTEGRATED CIRCUIT

BACKGROUND OF THE INVENTION

1. Field of the Invention

The present invention relates to the field of integrated circuit manufacturing and more specifically to novel methods and structures for fabricating high density flash memories.

2. Discussion of Related Art

Memory integrated circuits, such as flash memories (e.g., EEPROMS) are continually being scaled down in size in order to attempt to integrate greater numbers of storage cells onto a signal chip. However, certain device structures and fabrication techniques, such as but not limited to LOCOS isolation, contact resistance, and planarization techniques are reaching their performance and manufacturing limits. Thus, what is desired are new methods and structure which will enable the continued increase in device density and performance so that higher density flash memory circuits can be fabricated.

SUMMARY OF THE INVENTION

A method of fabricating a flash memory integrated circuit is described. In an embodiment of the present invention a dielectric filled trench isolation region is formed in a silicon substrate. The dielectric filled trench isolation region isolates a first portion of the silicon substrate from a second portion of the silicon substrate. A portion of the dielectric in the trench is then removed to reveal a portion of the silicon substrate in the trench between the first and second portions of the silicon substrate. Ions are then implanted to form a first source region in the first portion of the silicon substrate and to form a second source region in the second portion of the silicon substrate and to form a doped region in the revealed silicon substrate in the trench wherein the doped region in the trench extends from the first doped source region to the second doped source region.

BRIEF DESCRIPTION OF THE DRAWINGS

FIG. 21 is an illustration of a cross-sectional view taken along the bitline direction showing the formation of source/drain regions in the array portion of the integrated circuit of FIG. 20a.

DETAILED DESCRIPTION OF THE PRESENT INVENTION

The present invention describes a method of fabricating a novel flash memory integrated circuit. In the following description numerous specific details are set forth in order to provide a thorough understanding of the present invention. One of ordinary skill in the art however, will appreciate that these specific details are not necessary in order to practice the present invention. In other instances well known semiconductor fabrication processes and techniques have not been set forth in particular detail in order to not unnecessarily obscure the present invention.

Figure 1A:
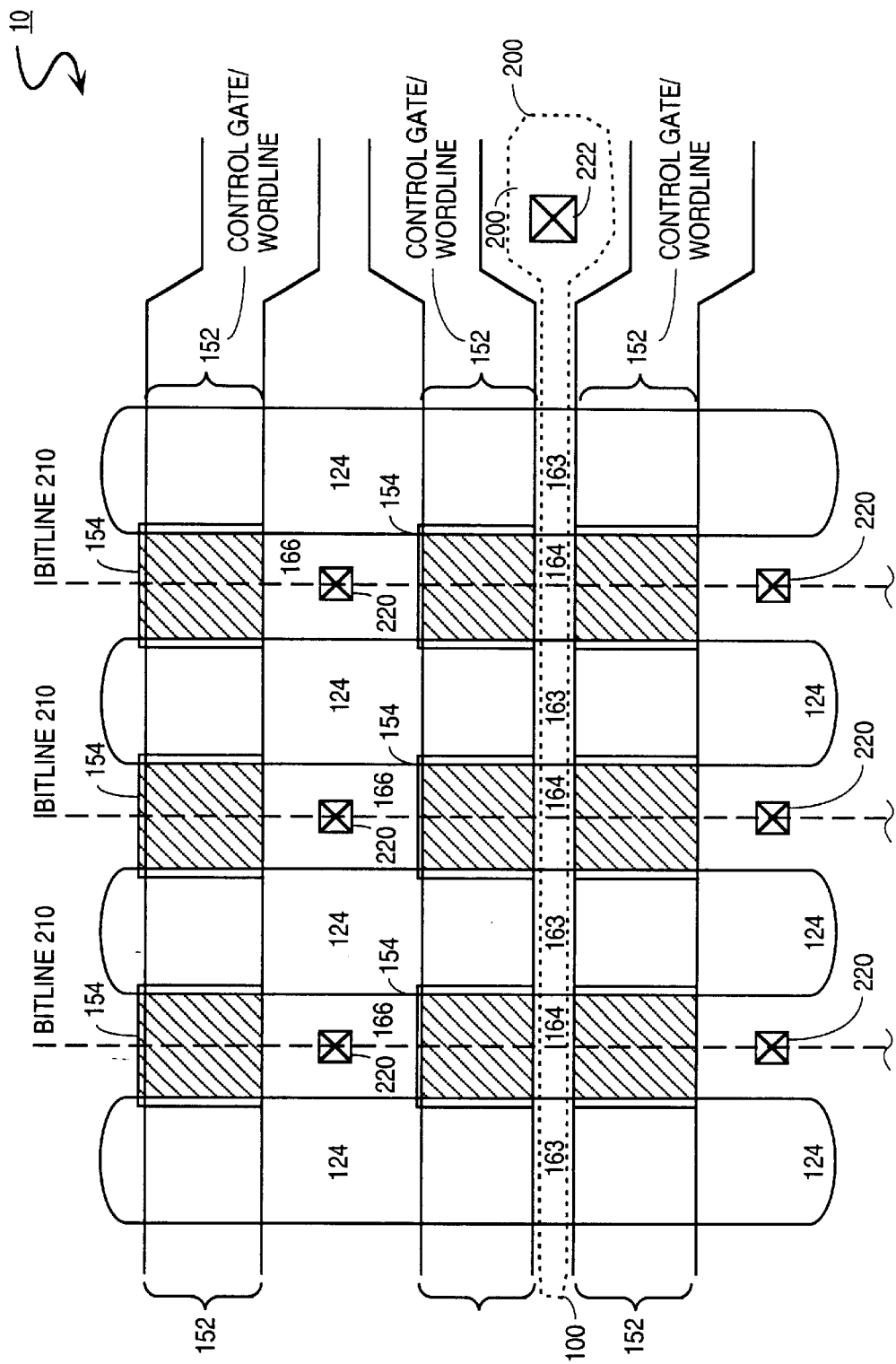
FIG. 1a is an illustration of an overhead view of a portion of a flash memory array.

The present invention describes a method of fabricating a novel flash memory integrated circuit. An illustration of an overhead view of a portion of a flash memory block 10 of a flash memory integrated circuit in accordance with an embodiment of the present invention is illustrated in FIG. 1a. Each block 10 comprises a plurality of flash cells laid out in a plurality of rows and columns. The rows are formed in the wordline direction while the columns are formed in bit line direction. Each flash cell comprises a lower floating gate 154, and interpoly dielectric (not shown), a control gate 152, and a source region 164 and a drain region 166. A common control gate 152, (or wordline) couples all flash cells of a row together while a common bit line, 210, couples all the drains 166 of a column of flash cells together as shown in FIG. 1a. The bit lines are formed in a first level metallization and uses contacts 220 to couple the drains together.

Each flash cell shares a source 164 with an adjacent flash cell in the column and shares a drain 166 with the other adjacent cell in the column. Shallow trench isolation regions 124 isolate a column of flash cells from an adjacent column of flash cells as shown in FIG. 1a. A common source rail 200 which runs parallel to the wordline direction couples a row of shared source regions 164 together. The common source rail 200 is formed through the isolation regions by removing the portion 162 of the isolation region between the shared source regions 164 prior to implanting ions for the formation of source regions 164. In this way, the common source regions 164 in a row can be coupled together thereby requiring only a single contact 222 to be made for every two rows of flash cells (e.g., second and third rows). Since the source rail 200 is used to coupled the shared source region 164 together, individual contacts are not necessary at the shared source regions enabling minimum spacing to be utilized between adjacent flash cells having a common source thereby increasing the density of the memory cells.

A method of forming a flash memory integrated a circuit in accordance with embodiments of the present invention will now be explained with respect to cross-sectional illustrations shown in FIGS. 2–31.

According to the present invention a silicon substrate is provided in which the flash integrated circuit of the present invention is to be fabricated. In an embodiment of the present invention the substrate 100 includes a monocrystalline silicon substrate 102 having a p-type epitaxial silicon film 104 with a dopant density of between $5 \times 10^{14}$–$5 \times 10^{15}$ atoms/cm$^3$ formed thereon. The starting substrate need not, however, be a silicon epitaxial film formed on a monocrystalline silicon substrate and can be other types of substrates. For the purpose of the present invention a substrate is defined as the starting material on which devices of the present invention are fabricated.

Figure 2:
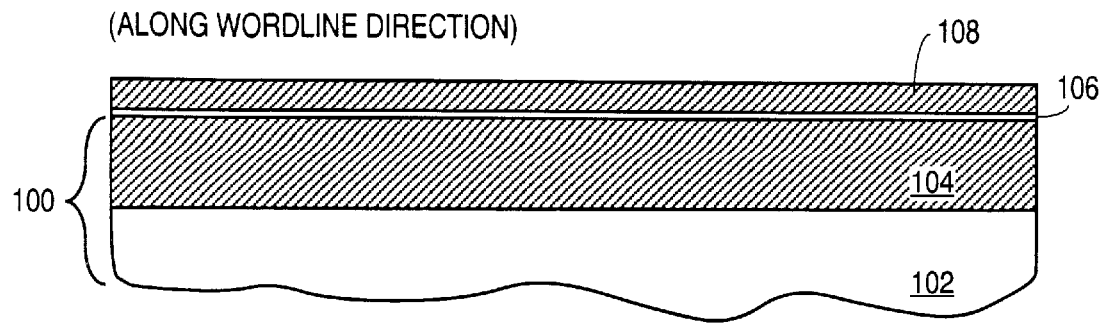
FIG. 2 is an illustration of a cross-sectional view of a substrate taken along the wordline direction showing the formation of a pad oxide and a nitride layer.

According to the present invention first isolation regions are formed in substrate 100. In order to fabricate high density integrated circuits the isolation region are preferably shallow trench isolations (STI) regions. An STI can be fabricated by thermally growing a pad oxide layer 106 of about 100 Å onto the surface of substrate 100 and then forming a silicon nitride layer 108 having the thickness of approximately 1500 Å onto the pad oxide layer 106, as shown in FIG. 2. (FIGS. 2–18 are all taken along the wordline direction)

Figure 3:
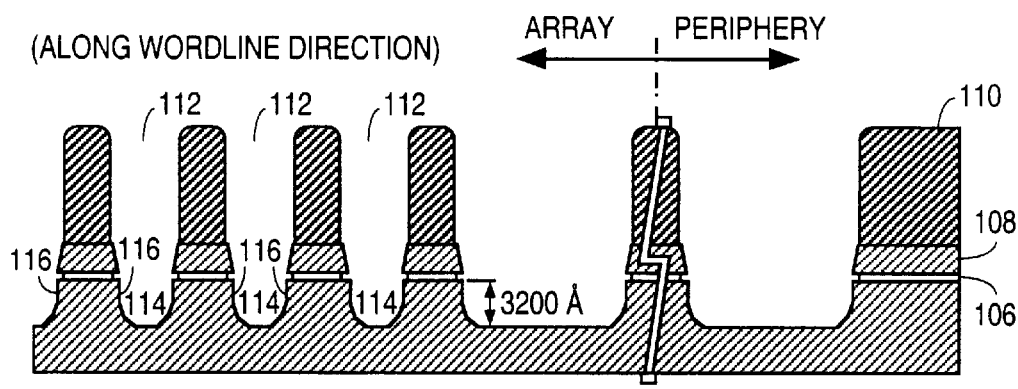
FIG. 3 is an illustration of a cross-sectional view taken along the wordline direction showing the formation of trenches in the substrate of FIG. 2.

Next, as shown in FIG. 3, a photoresist mask 110 is formed using well known masking, exposing, and developing techniques over nitride layer 108 to define locations 112 where isolation regions are desired. Isolation regions will be used to isolate a column of cells from an adjacent column of cells an for isolating the periphery active regions. Next, well known etching techniques are used to remove silicon nitride layer 108 and pad oxide layer 106 from locations 112 where isolation regions are desired. Nitride layer 108 can be plasma etched using a chemistry comprising sulfur hexaflouride ($SF_6$) and helium (He) and pad oxide 106 can be plasma etched with carbon hexaflouride ($C_2F_6$) and helium (He).

Next, silicon substrate 106 is etched to form trenches 114 where isolation regions are desired. The silicon trench etching step of the present invention forms a trench 114 with tapered sidewall 116. Sidewalls 116 are tapered or sloped to help enable a low source resistance rail to be formed. Sidewalls 116 are formed with a slope of between 60° to 80° from horizontal (i.e., from the silicon substrate surface) and preferably at 65° from horizontal. Tapered sidewalls 116 can be formed by plasma etching with chlorine ($Cl_2$) and helium (He). In an embodiment of the present invention trenches 114 are formed to a depth between 3000 to 4000 Å into silicon substrate 100.

Figure 4:
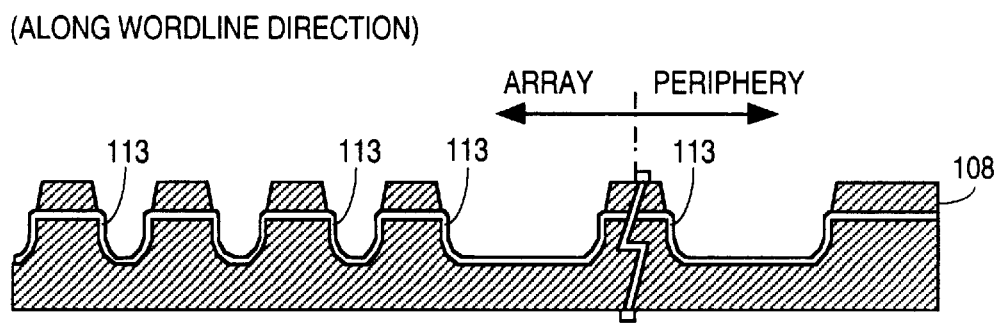
FIG. 4 is an illustration of a cross-sectional view taken along the wordline direction showing the formation of a first trench oxide on the substrate of FIG. 3.
Figure 5:
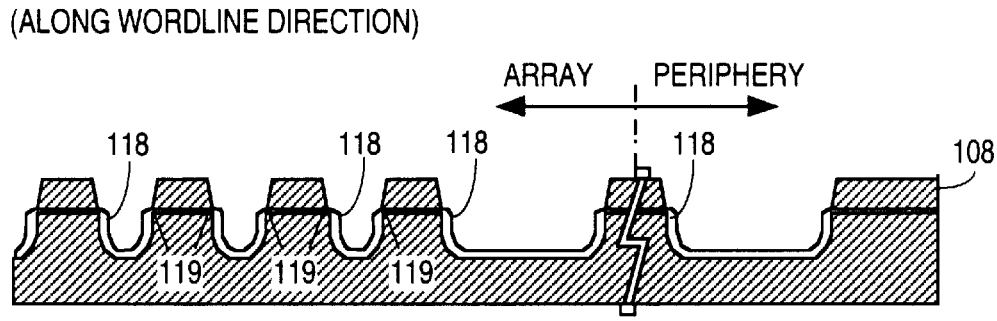
FIG. 5 is an illustration of a cross-sectional view taken along the word line direction showing the formation of a second trench oxide and the rounding of trench corners on the substrate of FIG. 4.

Next, as shown in FIG. 4, photoresist mask 110 is removed and a thin, approximately 100–300 Å thermal oxide 113 is grown over the sidewalls of trench 114. Thermal oxide 113 can be grown by heating substrate 100 to a temperature between 900–1000° C. while exposing the substrate to an oxidizing ambient such as but not limited to $O_2$. Next, the thermal oxide 113 is etched away using a wet etchant such as hydroflouric acid (HF). Next, as shown in FIG. 5, (along the wordline direction) a second thermal oxide 118 having a thickness between 300–600 Å is grown on the silicon sidewalls of trench 114. In an embodiment of the present invention thermal oxide 118 is grown with a two step oxidation process, at first oxidation occuring in a dry ambient, such as $O_2$, followed by a second oxidation occurring in a wet ambient (i.e., in an ambient including water ($H_2O$)). The oxide growth/etch/oxide growth process of the present invention rounds the silicon corners 119 of trench 114. It is to be appreciated that sharp trench corners can cause a weakness in the subsequentally formed tunnel oxide at the corners. A weak tunnel oxide at the trench corners can cause cells in a single block to erase differently when tunneling electrons off the floating gate. By rounding the trench corners with the oxide growth/etch/oxide growth process of the present invention corners are rounded and all memory cells in a given memory block can erase at the same rate. Rounded corners 119 of trench 114 enable the reliable integration of shallow trench isolation (STI) regions with flash memory cells. Corner rounding also improves the performance of cmos devices in the periphery.

In an alternative method for rounding trench corners 119 one can first expose trench 114 to an HF dip to remove a portion of the pad oxide beneath the silicon nitride film and then grow oxide film 113 to round the corners. If desired trench oxide 113 can then be etched away followed by the formation of oxide 118.

Figure 6:
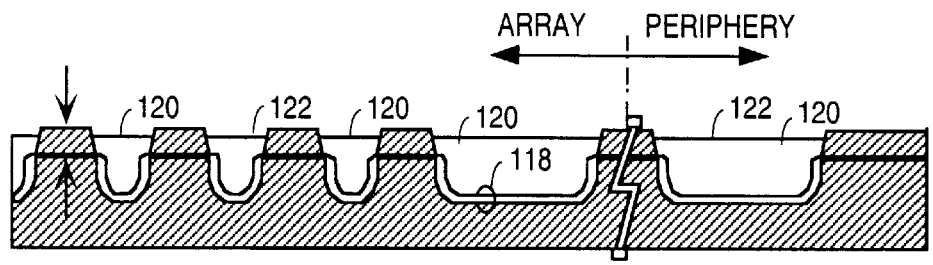
FIG. 6 is an illustration of a cross-sectional view taken along the wordline direction showing the filling of the trench isolation regions of the substrate of FIG. 5.
Figure 7:
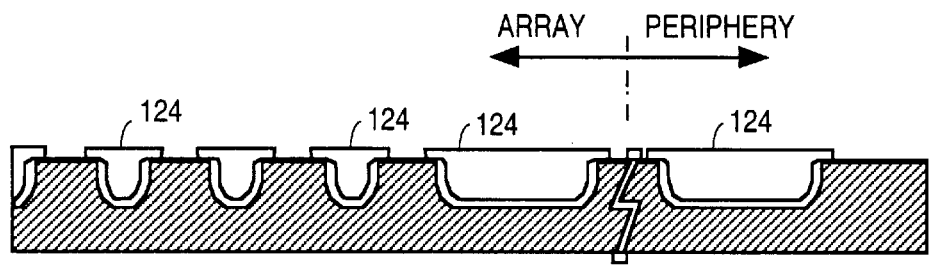
FIG. 7 is an illustration cross-sectional view taken along the wordline direction showing the removal of the silicon nitride and pad oxide layers from the substrate of FIG. 6.

Next, as shown in FIG. 6 a trench fill material 120 such as silicon oxide, is blanket deposited by chemical vapor deposition (CVD) over silicon nitride layer 108 and thermal oxide layer 118 in trench 114. The dielectric fill material 120 is then polished back by chemical mechanical polishing until the top surface 122 of the isolation region is substantially planar with the top surface of silicon nitride layer 108 and all oxide removed from the top of the silicon nitride as shown in FIG. 6. Next, as shown in FIG. 7, silicon nitride layer 108 and pad oxide layer 106 are removed with well known techniques to form a shallow, compact, and planar isolation region 124.

Figure 8:
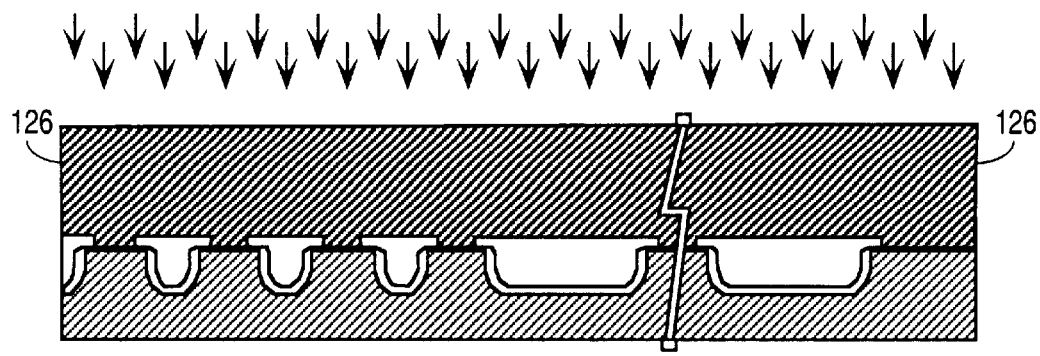
FIG. 8 in an illustration of the cross-sectional view taken along the wordline direction showing the formation of an n-well photoresist mask over the substrate of FIG. 7.

Next, n-type and p-type well implants are made. In one embodiment of the present invention where the peripheral circuitry utilizes CMOS circuitry (i.e. utilizes nMOS and pMOS transistors) and n-type implant is made as shown in FIG. 8. A photoresist mask 126 is formed over the entire array portion of the integrated circuit and over those portions of the periphery which are to be fabricated into n-type devices. N-type dopants, such as phosphorous or arsenic, can be ion implanted at dose between $3-8 \times 10^{12}$ atom/$cm^2$ and at an energy between 100–800 KeV to form n-type wells in substrate 100 to act as the channel regions for the pMOS devices in the periphery.

Figure 9:
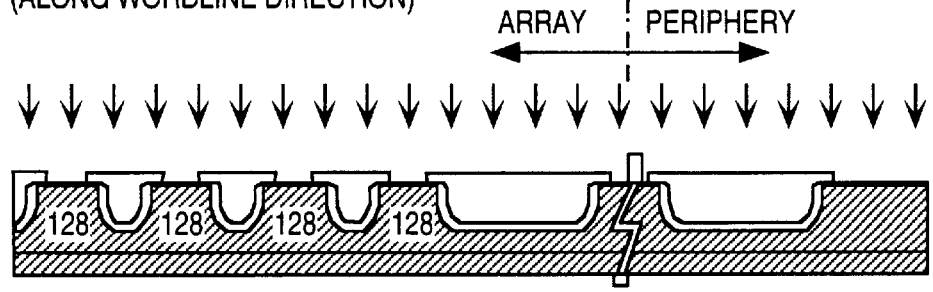
FIG. 9 is an illustration of the cross-sectional view taken along the wordline direction showing the formation of p-wells in the substrate of FIG. 8.

Next, as shown in FIG. 9, photoresist mask 126 is removed with well known techniques, and a second photoresist mask (now shown) is formed over the periphery of substrate 100 to define the locations where p-well implants are to be made. The p-well implant forms p-wells 128 between shallow trench isolation regions 124. The p-well regions extend deeper into substrate 100 then STI regions 124. P-wells 128 can be formed by well known ion implantation techniques utilizing boron ($B^{11}$) at an energy of between 300–500 KeV and a dose of between ($5 \times 10^{12} - 2 \times 10^{13}$ atoms/$cm^2$). Additionally, the p-well implant can be used to form p-wells in the periphery portion of integrated circuit to form channel regions for the nMOS devices in the peripheral. A p-well photoresist mask can be used to prevent doping of the pmos regions in the periphery.

Figure 10:
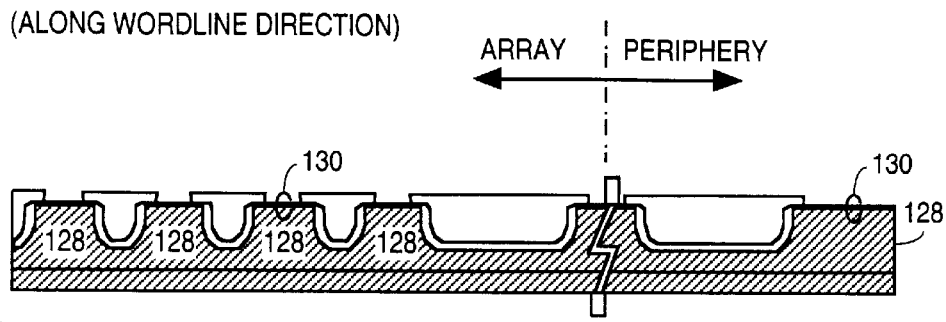
FIG. 10 is an illustration of a cross-sectional view taken along the wordline direction showing the formation of a sacrificial oxide and well drive in the substrate of FIG. 9.

Next, as shown in FIG. 10, the p-well photoresist mask is removed and substrate 100 heated to drive the n-type and p-type wells to the desired depth. A sacrificial oxide layer 130 having a thickness of between 100–300 Å is grown over substrate 100 during the drive step. Next, p-type dopants can be implanted into the array portion of the integrated circuit in order to optimize the electrical characteristics of the flash cell.

Figure 11:
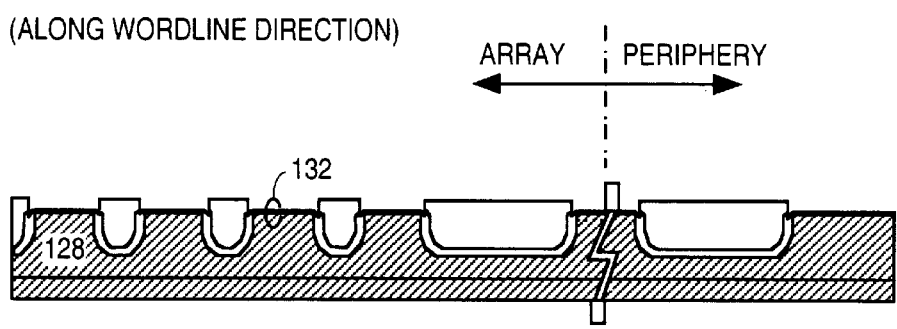
FIG. 11 is an illustration of a cross-sectional view taken along the wordline direction showing the formation of a tunnel oxide on the substrate of FIG. 10.

The sacrificial oxide layer 130 is then stripped off by well known techniques, such as an HF dip, and a high quality tunnel oxide layer 132 having a thickness between 60–120 Å is grown over substrate 100 as shown in FIG. 11. A high quality tunnel oxide can be formed by thermal oxidation of the silicon substrate by exposing silicon substrate 100 to an oxidizing ambient, such as $O_2$ while heating substrate 100 to a temperature of between 750–950° C. in either a furnace or a rapid thermal processor (RTP).

Figure 12:
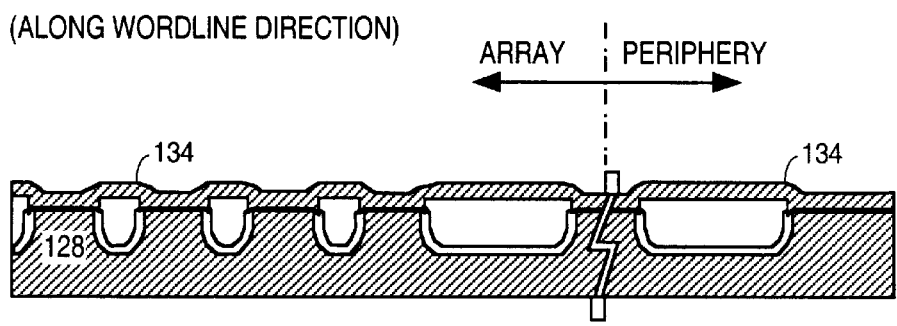
FIG. 12 is an illustration of a cross-sectional view taken along the wordline direction showing the formation of a polysilicon layer on the substrate of FIG. 11.

Next, a first polysilicon layer 134 is blanket deposited over substrate 100 including isolation regions 124, as shown in FIG. 12. In an embodiment of the present invention the first polysilicon layer 134 is formed to a thickness between 1000–3000 Å and is doped with n-type conductivity ions to a doping density of approximately $5 \times 10^{19}$ atoms/$cm^3$. Polysilicon layer 134 can be formed by chemical vapor deposition (CVD) and can be doped insitu (e.g. during polysilicon deposition) or by ion implantation after polysilicon deposition.

Figure 13:
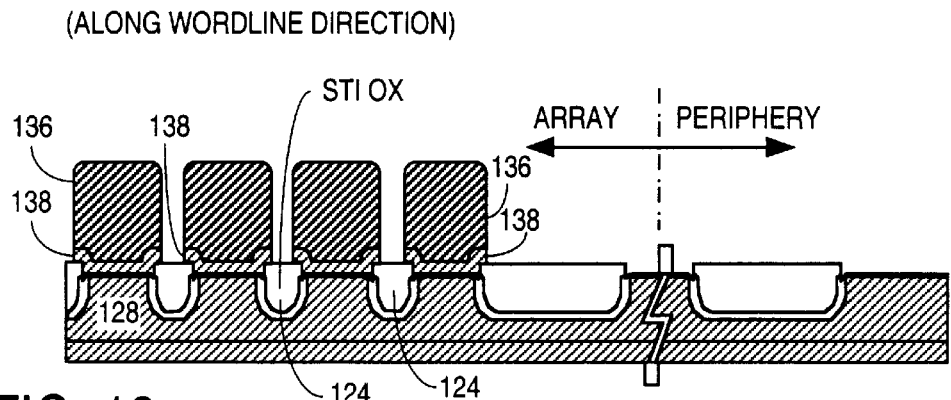
FIG. 13 is an illustration of a cross-sectional view taken along the wordline direction showing the patterning of the first polysilicon layer on the substrate of FIG. 12.

Next, as shown in FIG. 13, a photoresist mask 136 is formed over substrate 100 to initially define the locations where floating gate lines are to be formed from polysilicon layer 134. Next, as also shown in FIG. 13, the first polysilicon layer is etched with well known techniques in alignment with photoresist mask 136 to pattern polysilicon layer 1 into a plurality of floating gate lines 138. The patterning of the first polysilicon layer defines a plurality parallel lines in the first polysilicon layer that run into and out of the page of FIG. 13. (i.e., lines 138 extend in the bit line direction).

Figure 14:
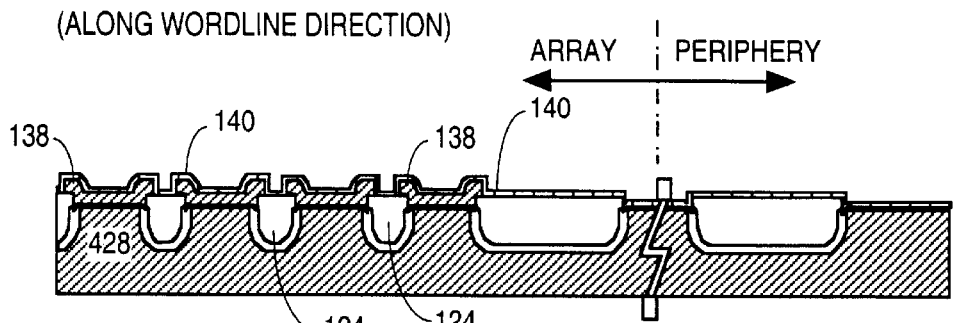
FIG. 14 is an illustration of a cross-sectional view taken along the wordline direction showing the formation of a interpoly dielectric on the substrate of FIG. 13.

Next, as shown in FIG. 14, photoresist layer 136 is removed. A interpoly dielectric 140 is then blanket formed over the patterned first polysilicon layer lines 138 and over trench isolation regions 124. In an embodiment of the present invention interpoly dielectric is a composite oxide comprising a lower thermally grown oxide film, a middle deposited silicon nitride film and a top deposited oxide film. Such an the interpoly dielectric is sometimes referred to as a ONO dielectric. It is to be appreciated however, that other well known interpoly dielectrics may be utilized. In an embodiment of the present invention the ONO stack has a thickness between 150–250 Å. At this time, if desired, boron ions can be implanted into the periphery portion of the integrated circuit in order to adjust the threshold voltage of the nMOS devices, and arsenic and phosphorus can be implanted into pmos devices to adjust their threshold voltages.

Figure 15:
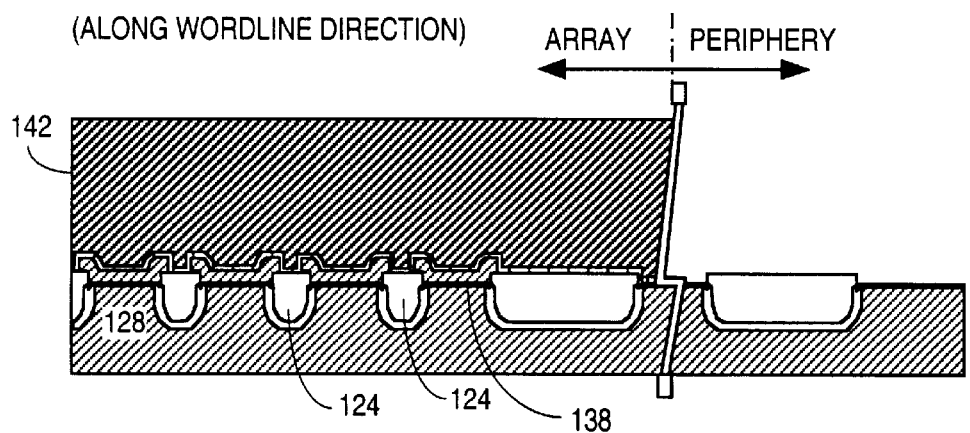
FIG. 15 is an illustration of a cross-sectional view taken along the wordline direction showing the removal of the interpoly dielectric from the periphery portion of the integrated circuit.
Figure 16:
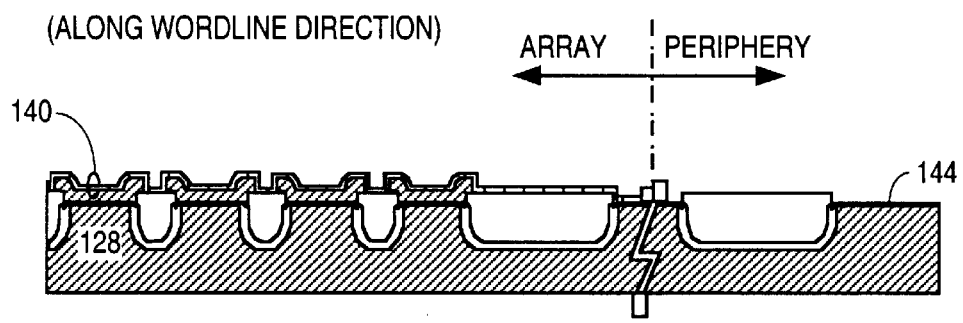
FIG. 16 is an illustration of a cross-sectional view taken along the wordline direction showing the formation of a gate dielectric on the periphery portion of the substrate to FIG. 15.
Figure 17:
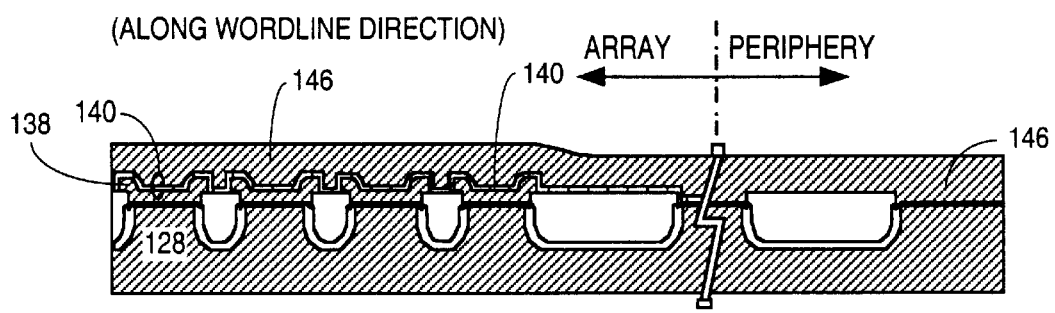
FIG. 17 is an illustration of a cross-sectional view taken along the wordline direction showing the formation of a second polysilicon film on the substrate of FIG. 16.
Figure 18:
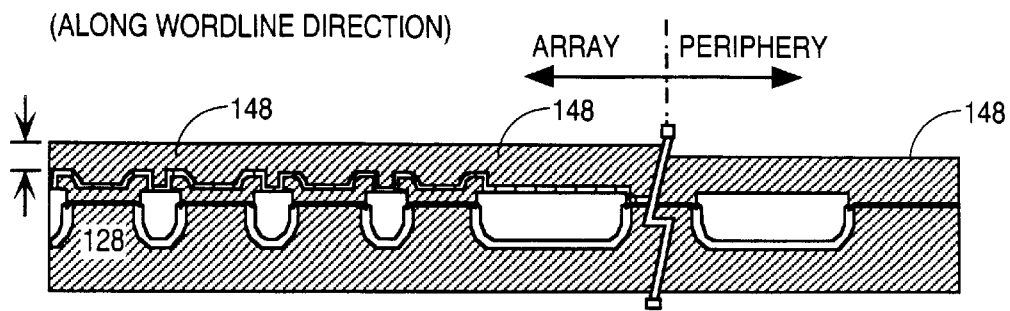
FIG. 18 is an illustration of a cross-sectional view taken along the wordline direction showing the planarization of the second polysilicon layer on the substrate of FIG. 17.

Next, as shown in FIG. 15, a photoresist mask 142 is formed over substrate 100 and covers the array portion of the integrated circuit and exposes the periphery portion of the integrated circuit. Next, as shown in FIG. 15, the interpoly dielectric 140 is removed from the peripherial portion of the integrated. Next, as shown in FIG. 16, a gate dielectric layer 144 is grown on the silicon substrate 100 in the periphery of integrated circuit. Next, as shown in FIG. 17, a second polysilicon layer 146 is blanket deposited over substrate 100. The second polysilicon layer 146 is formed over the interpoly dielectric 140, over polysilicon lines 138, and over interpoly dielectric 140 over the shallow trench isolation regions 124 in the array portion of integrated circuit and is formed over the gate oxide layer 144 in the peripherial portion of integrated circuit. In an embodiment of the present invention the second polysilicon layer is deposited to a thickness between 3000–5000 Å. Second polysilicon film 146 can be formed by any well known techniques such as by chemical vapor deposition and can be insitu doped or subsequentally doped by ion implantation if desired. In an embodiment of the present invention polysilicon film 146 remains undoped at this time and is subsequently doped by the cell and cmos source/drain implant. Next, as shown in FIG. 18, a second polysilicon layer 146 is planarized by chemical mechanical polishing in order to form a planar top surface 148. In an embodiment of the present invention second polysilicon layer is polished until approximately between 2000–2500 Å of polysilicon remains above interpoly dielectric 140. The planar surface 148 of second polysilicon layer 146 enables improved lithography for the subsequent patterning or delineation of polysilicon layer 146. Polishing of polysilicon layer 146 is crucial for enabling good critical dimension (CD) control during subsequent patterning of poly silicon layer 146. Polishing of polysilicon layer 146 helps enable high density fabrication of flash cells.

Figure 19A:
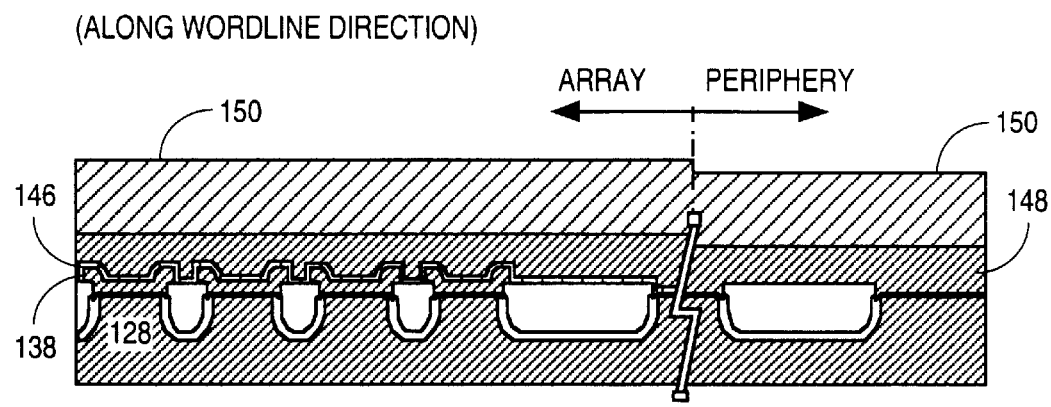
FIG. 19a is an illustration of a cross-sectional view taken along the wordline direction showing the formation of a poly 2 patterning mask on the substrate of FIG. 18.
Figure 19B:
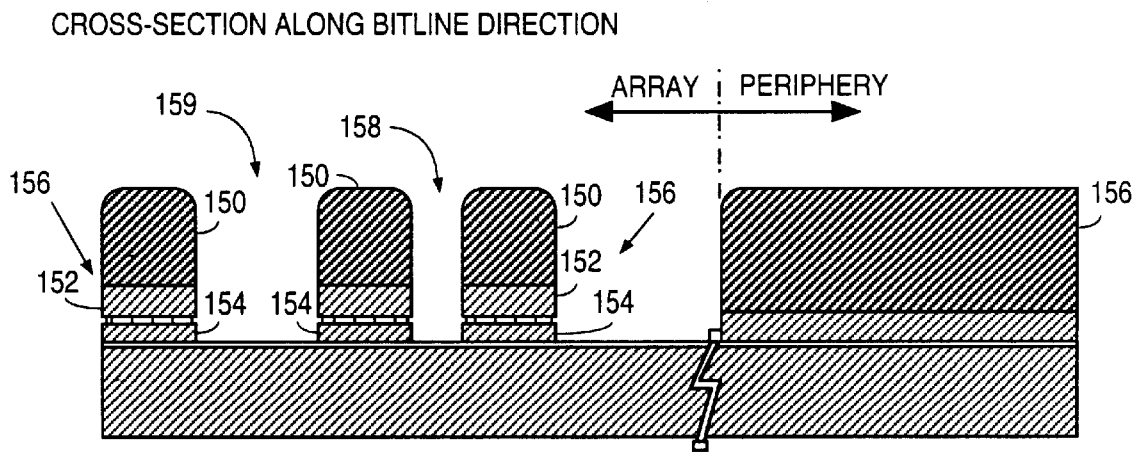
FIG. 19b is an illustration of a cross-sectional view taken along the bitline direction showing the patterining of the polysilicon layer, the interpoly dielectric and the first polysilicon lines on the substrate of FIG. 18.

Next, as shown in FIGS. 19a and 19b, a photoresist mask 150 is formed over substrate 100 and the exposed portions of polysilicon film 146, interpoly oxide 140, and polysilicon lines 138 are anisotropically etched in alignment with photoresist mask 150 in order to form a plurality of flash cells and control lines. FIG. 19a is a cross-sectional view of substrate 100 taken along the word line direction while FIG. 19b is a cross-sectional view taken along the bit line direction (FIG. 19a is perpendicular to the cross-section of FIG. 19b). As shown in FIGS. 19a and 19b, the masking and etching processes patterns second polysilicon layer 146 into a plurality of control gate lines 152, as shown in FIG. 19b. Each of the control gate lines 152 extend in the word line direction and pass over each of the poly floating gates along a row in a word line direction as shown in FIG. 19a. Additionally, as shown in FIG. 19b the masking and etching process also removes the exposed portion of first polysilicon lines 138 in order to define a plurality of discrete floating gate 154. That is, the masking and etching steps remove the portion of polysilicon lines 138 which are not covered by controll gate lines 152 as shown in FIG. 19b. Additionally, as shown in FIG. 19b, the masking and etching steps form a plurality of poly 152/dielectric 140/poly 152/stacks 156. As shown in FIG. 19b, a cell stack in the column are separated on one side from the adjacent cell by the minimum spacing 158 which can achieved by the photolithography/etching technique used. For example, if the photolithography/etching technique can form lines having a 0.25 micron dimension then the cells which have a shared source will be separated by the minimum 0.25 micron dimension. Additionally, adjacent stacks which share a common drain are separated by dimension 159 which are large enough to form a metal contact to the common drain regions. Second polysilicon layer 146, and polysilicon lines 138 can be antisotropically etched utilizing a plasma etch comprising the chemistry of HBr, chlorine (Cl2) and helium (He) and ONO dielectric 140 can be plasma etched using $C_2F_6$ and $O_2$.

Figure 20A:
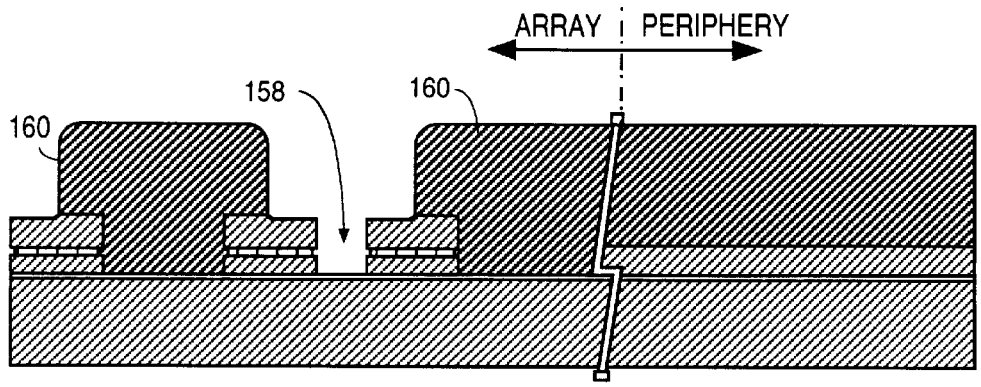
FIG. 20a is an illustration of a cross-sectional view taken along the bitline direction showing the formation of a photoresist mask which reveals the portions of the silicon substrate for the shared source regions and a portion of the shallow transisolation which is to be removed.
Figure 20B:
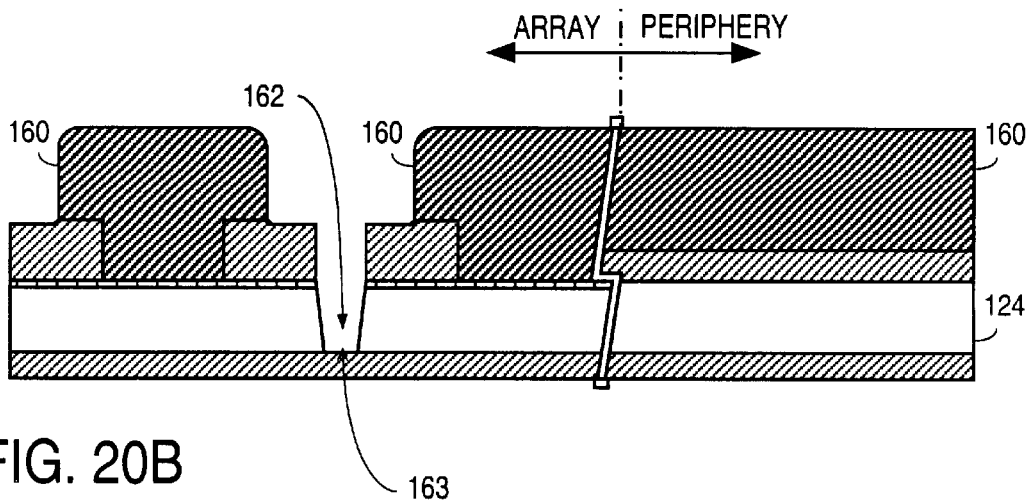
FIG. 20b is an illustration of a cross-sectional view taken through the shallow trench isolation regions in the bitline direction showing the portion of the shallow trench isolation which is to be removed to generate the source rail.

Next, as shown in FIGS. 20a and 20b, a mask 160 is formed over substrate 100. FIG. 20a is a cross-sectional view through the cell source/drain region taken along the bit line direction while FIG. 20b is a cross-sectional view through a STI region (124) taken along the bit line direction. Mask 160 defines location where a source rail will be formed which connects a row of shared source regions. Mask 160 exposes portion 158 of substrate 100 between each of the flash cell pairs where the common source is to be formed. The mask also exposes the portion 162 of shallow trench isolation region located between the common source regions making up a row of common source regions. Next, as also shown in FIG. 20a and FIG. 20b substrate 100 is exposed to an oxide etchant which is highly selective to silicon (i.e., exposed to an etchant which etches oxide but not silicon). An etchant having an at least 20:1 selectivity between oxide and silicon is preferred. The oxide etchant removes the portion of shallow trench isolation regions exposed by mask 162. The exposed shallow isolation region is etched until all of the exposed oxide is removed to expose the underlying portion of p-type epitaxial substrate. Removing portions 162 of STI regions 124 forms a continuous row of silicon which will eventually form a continuous source rail for electrically coupling a row of shared source regions.

Figure 21:
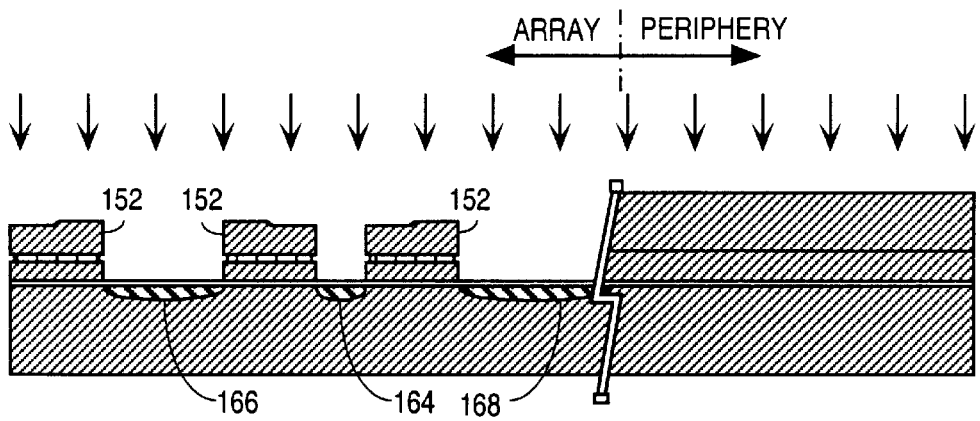

Next, as shown in FIG. 21 (along the bit line direction) n-type source/drain implants are made into the array. According to the present invention n-type dopants are implanted into substrate 100 on opposite sides of 75 stacks 156. In an embodiment of the present invention arsenic ($As^{75}$) ions are blanket implanted into the array portion of substrate 100 at a dose of between 1.0 to $3.0 \times 10^{15}$ atom/cm$^2$ at an energy of between 10–20 KeV while the periphery is masked. The n-type source/drain implant use a 90° implant angle (i.e., ions are implanted perpendicular to the surface of substrate 100) as shown in FIG. 21. The ion implantation step forms the shared source regions 164 and forms a shared drain region 166 between flash cells. In this way each flash cell shares a drain with an adjacent flash cell in the column and shares a source with the other adjacent flash cell in the column. Additionally, the source/drain implant also places dopants into substrate portion 163 were STI portion 162 was removed. Because the source/drain ion implant step in the array is not masked the control gate 152 acts as the mask preventing the n-type dopants from doping the channel region of the flash cells. The source/drain implant step also dopes the second polysilicon layer in the array alleviating the need for a separate doping step to dope the second polysilicon layer. The relatively low energy source/drain implant forms shallow and abrupt source/drain regions.

Figure 22:
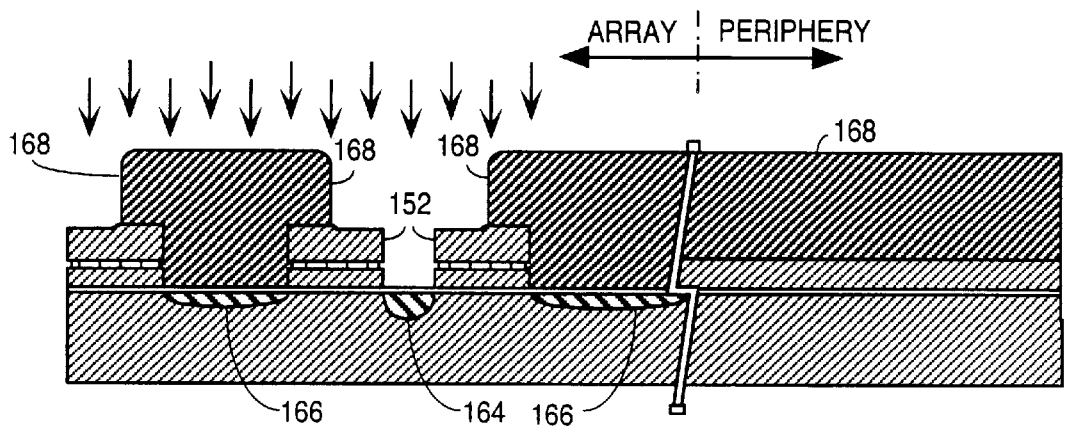
FIG. 22 is an illustration of a cross-sectional view taken along the bitline direction showing the formation of a graded and heavily doped source region in the substrate of FIG. 21.

Next, as shown in FIG. 22, (along the bit line direction) a mask 168 similar to mask 160 is formed over substrate 100. Mask 168 exposes the common source regions 164 and the doped silicon regions 163 between the common source region 164 where portion 162 of STI regions 124 were removed. Next, a second ion implantation of n-type dopens can be formed into the common source regions and into the doped silicon substrate regions 163 in order to increase the conductivity type of a source region and to increase the conductivity of the source rail to thereby reduce the resistivity of the rail and improve performance. The additional source implant can be carried out utilizing a first doping of phospherous atoms ($P^{31}$) at an energy between 10–20 KeV and at a dose of between $1-10 \times 10^{14}$ atoms/cm$^2$ followed by a second doping with arsenic atoms ($As^{75}$) at a dose between $2-5 \times 10^{15}$ atoms/cm$^2$ at an energy between 16–20 KeV. Like the source/drain implant the source implant implants ions perpendicular (90°) to the surface of the substrate. The source/drain implant and the source implant create a low resistant shared source regions 164 and a low resistance source rail in the substrate portion 163 connecting the shared source/drain regions 164. By utilizing the additional source doping techniques shown in FIG. 22, asymmetrical source and drain doping profiles are achieved for the flash cells. The drain regions have a relatively shallow and uniform doping profile, while the sources 164 have a relatively deep and graded profile. Additionally, shared source regions 164 are doped to a higher concentration in order to help reduce the source rail resistance. The ion implantation steps create a source rail having a resistance of between 100–300 ohms/ cell.

Figure 1B:
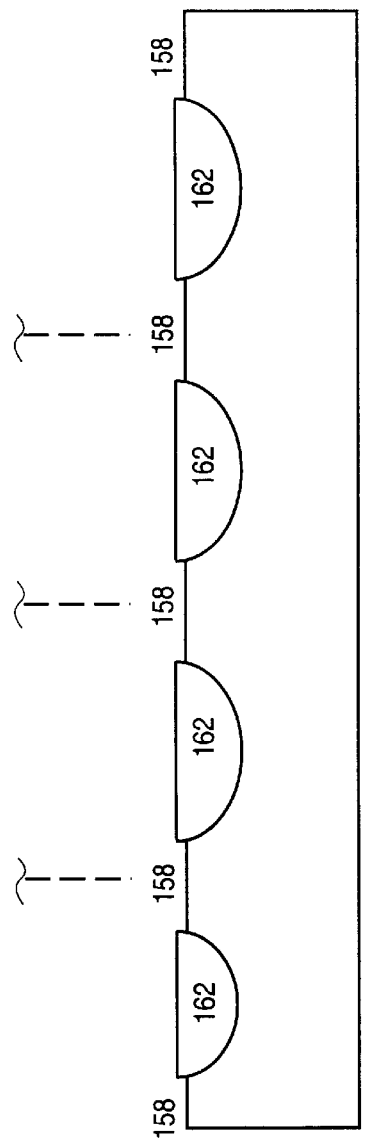
FIG. 1b is an illustration of a cross-sectional view taken along a wordline direction showing the formation of a plurality of shallow trench isolation regions.
Figure 1C:
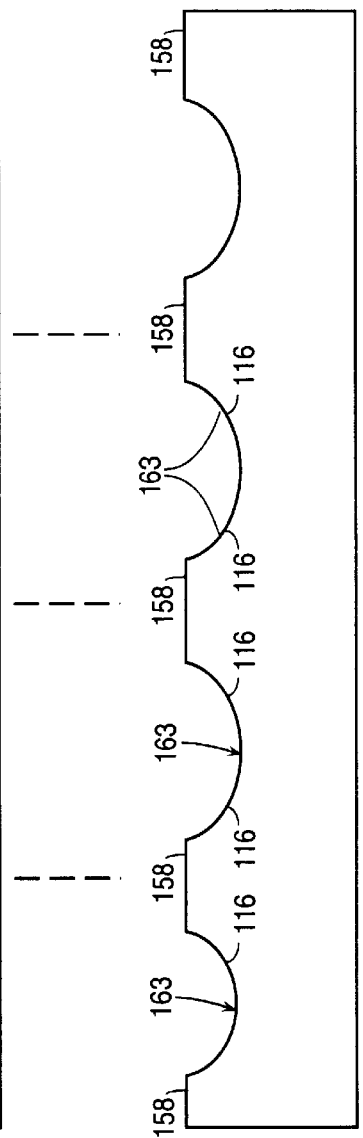
FIG. 1c is an illustration of a cross-sectional view taken along the wordline direction showing the removal of a portion of the shallow trench isolation regions from the substrate of FIG. 1b.
Figure 1D:
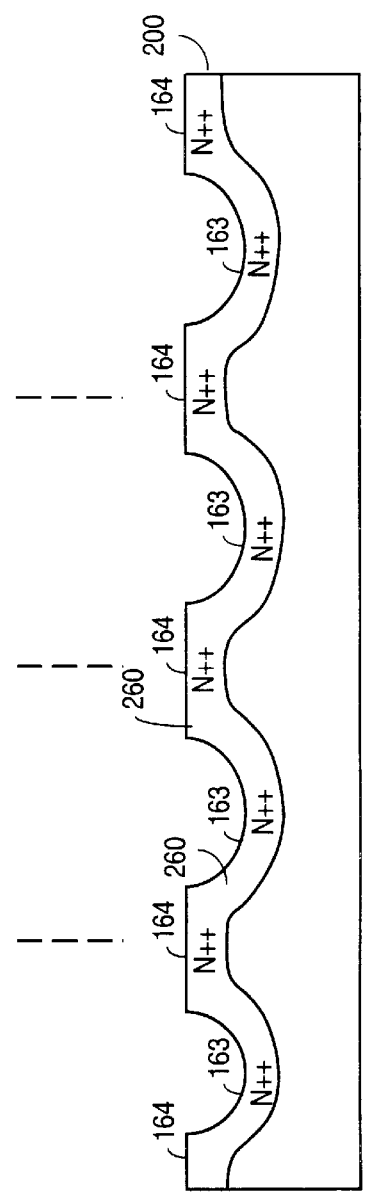
FIG. 1d is an illustration of a cross-sectional view taken along the wordline direction showing the formation of doped regions in the substrate of FIG. 1c.

Referring to FIGS. 1a–1d, the low resistance source rail fabrication aspect of the present invention is further described. FIG. 1a is an over head view of the array portion of integrated circuit. FIG. 1b is a cross-sectional view of FIG. 1b taken in the wordline direction through the shared source regions after formation of mask 160 (in FIG. 20) and prior to the etching of STI portion 162. As is readily apparent in FIG. 1b the masking step shown in FIG. 20 exposes the silicon substrate 158 where the shared source drain regions are to be regions formed and exposes the STI portion 162 located between silicon substrate 158. Next, as shown in FIG. 1c, the highly selective oxide etch of FIG. 20 removes those portions 162 of the STI regions between regions 158 in a row of the array to reveal substrate portions 163 beneath the removed portions 162. Next, as shown in FIG. 1d, during the source/drain doping describe with respect to FIG. 21 and the source doping shown in FIG. 22, substrate area 150 is doped to form common source region 164. Additionally, the doping of FIGS. 21 and 22 also doped the silicon portion 163 between shared source regions 164 shown in FIG. 1d. Thus, each shared source region in a row is coupled by a doped substrate region 163 to the adjacent shared source region 164 as to form a source rail 200 for a row of cells. A single contact point (which is eventually silicided) is used to electrically connect the source rail 200 to circuitry of the integrated circuit. Because sidewalls 116 of STI 124 where adequately sloped during the formation of trench 114, 90° angled implantation steps can be used to adequately dope the sidewalls of silicon region 163 without the use of an elaborate doping technique such as large angled implant. The source rail 200 is heavily doped silicon having an n-type doping density of at least $5 \times 10^{19}$ atoms/per $cm^3$. The minimum depth of the source rail 200 which occurs at the sidewalls 116 is at least 0.1 microns thereby enabling a low resistance source rail 200 to be formed. The present invention can form the low resistance rail of less than 200 ohms per cell.

Next, the second polysilicon layer in the peripherial portion of integrated circuit can now be masked exposed and etched to pattern the second polysilicon layer into gates in the peripherial portion of the integrated circuit. This step can be formed prior to forming cell gates and cell source/drain regions.

Figure 23:
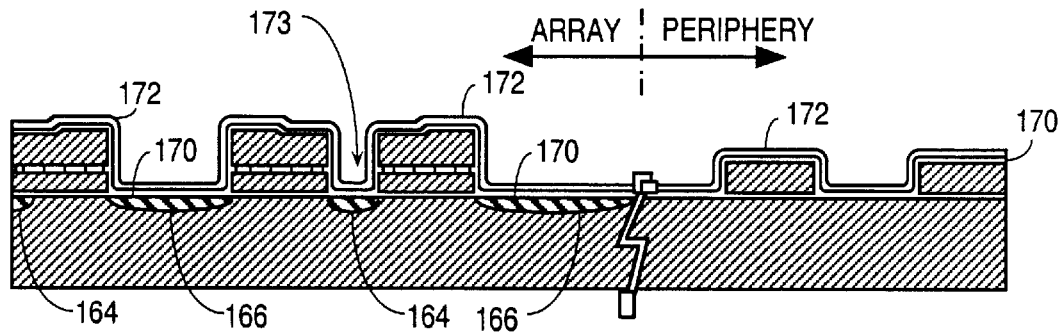
FIG. 23 is an illustration of a cross-sectional view taken along the bitline direction showing the formation of a thermal oxide and a high temperature oxide over the substrate of FIG. 22.

Next, as shown in FIG. 23, (along the bit line direction), a thin thermal oxide 170 is grown over the top and over the sidewalls of the flash cells and over the exposed portions of a silicon substrate 100 (e.g., source/drain regions 164 and 166 and source rail portions 163). The thermal oxide passivates the sidewalls of the flash cells as well as thickens the oxide near the gate edges. Next, a thin, approximately 200 Å, high temperature oxide 172 (HTO) is blanket deposit by CVD over the thermal oxide 170 as shown in FIG. 22. The high temperature oxide acts as an etch stop for a subsequent silicon nitride spacer etch step.

At this time one can form n-type tip regions in the periphery portion of the substrate to form n-type tip regions for the n-mos devices in the periphery. Additionally, at this time p-type tip implants for the periphery portion of the circuit can be made. During the p-type and n-type tip implants of the periphery portion of the circuit a mask covers the array portion of the substrate so that no doping of the array portion occurs.

Figure 24:
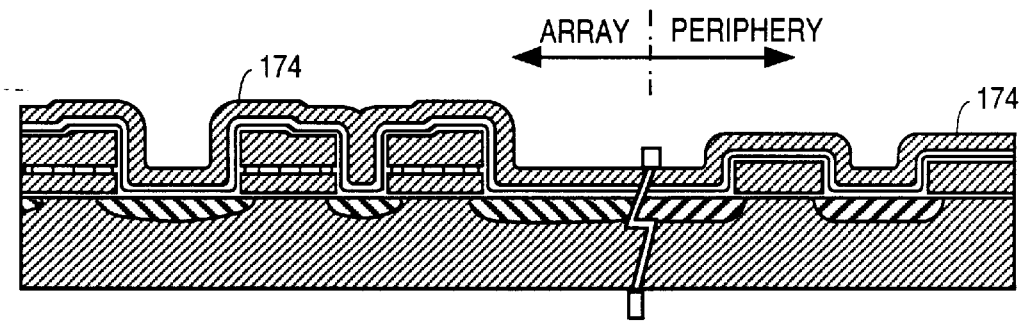
FIG. 24 is an illustration of a cross-sectional view taken along the bitline direction showing the formation of a silicon nitride layer over the substrate of FIG. 23.

Next, a silicon nitride film 174 is blanket deposited over substrate 100 as shown in FIG. 24 (taken along the bit line direction). Silicon nitride film 174 will be used to form spacers. The deposition thickness of the silicon nitride film 174 dictates the width of the subsequently formed spacers. Silicon nitride layer 174 is formed to a thickness at least half the distance 173 (see FIG. 23) between flash cells having a shared source 164 so that the narrow source space 173 between cells having shared source is completely filled with silicon nitride 174 as shown in FIG. 24. In, an embodiment of the present invention silicon nitride film 174 is deposited to a thickness of between 1200–2500 Å. In a case when the narrow source space 173 between the flash cell having a shared source is approximately 0.25 microns, silicon nitride film 174 is formed to a thickness of approximate 1250 Å. Any well known technique which can be used to deposit a comformal silicon nitride layer, such as chemical vapor deposition utilizing source gases comprising ammonia $NH_3$ and silane $SiH_4$ can be used to deposit silicon nitride film 174.

Figure 25:
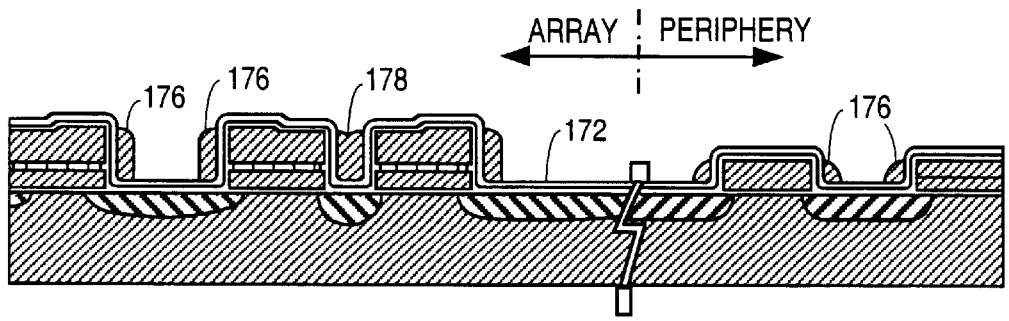
FIG. 25 is an illustration of a cross-sectional view taken along the bitline direction showing the formation of spacers and plugs from the silicon nitride layer on the substrate of FIG. 24.

Next, as shown in FIG. 25 (along the bit line direction) silicon nitride film 174 is antisotropically etched to form a plurality of spacers 176 which run along sidewalls of each flash stack. Additionally, the antisotropic etch leaves a silicon nitride stud 178 in the narrow source gap between the cells sharing a source region. Silicon nitride stud 178 prevents contaminants from subsequent processing steps from adversely effecting the reliability and quality of the tunnel oxide and interpoly dielectric. Deposited oxide layer 172 acts as an etch stop for the antisotropic silicon nitride etch step. Any antisotropic etching technique which preferentially etches silicon nitride as compared to silicon dioxide can be used, such as plasma etching utilizing the chemistry comprising sulfur hexaflouride ($SF_6$) and helium (He). The silicon nitride etch step also forms spacers 176 which run along laterally opposite sidewalls of patterned polysilicon layer 146 in the peripheral portion of the integrated circuit.

Figure 26:
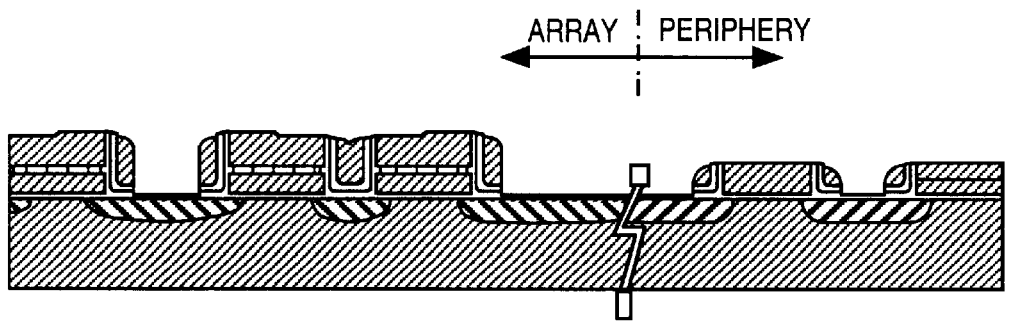
FIG. 26 is an illustration of a cross-sectional view showing the removal of the oxide layer from the substrate of FIG. 25.

Next, as shown in FIG. 26 (along the bit line direction) an etch step is used to remove the oxide films 172 and 170 from the active regions not protected by the nitride spacers as well as from the top of the second polysilicon layer. A plasma etch using a chemistry comprising carbon hexaflouride ($C_2F_6$) and helium can be used to remove oxide films 172 and 170. Next, at this time an n+source/drain implant mask can be formed which covers the entire array portion of integrated circuit and covers the pmos portion of the periphery of the integrated circuit and then heavy n+source/drain implants made for the nmos devices. Similarly at this time a p+source/drain implant mask can be formed over the array portion of integrated circuit and over those portion of the periphery used to form nmos devices and then heavy p+source/drain implants made into the peripheral circuit. During the n+source/drain implant and p+source/drain implant made into the peripheral circuit, the array portion is masked in order to prevent the relatively deep implants made into the periphery from affecting the relatively shallow drain 166 and the graded source 164 formed in the array portion of integrated circuit.

Figure 27:
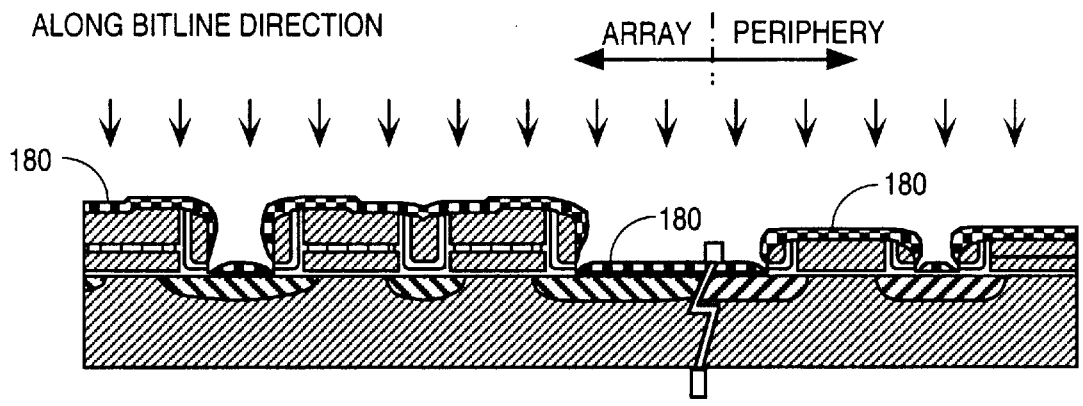
FIG. 27 is an illustration of a cross-sectional view taken along the bitline direction showing the formation of a metal layer of the substrate FIG. 26.

Next, as shown in FIG. 27, (along the bit line direction), a metal film 180 is blanket deposited over substrate 100. Any metal film which can react with silicon to form a low resistance metal silicide when heated to a suitable temperature may be utilized. Prior to metal film deposition a short HF dip can be used to remove any native oxides. In a preferred embodiment of the present invention the metal film 180 is titanium deposited to a thickness between 200–500 Å. Any well known technique such as but not limited to sputtering, can be used to blanket deposit metal film 180. If desired, silicon atoms ($Si^{28}$) can be implanted into metal film 180 at a dose of between $2-4 \times 10^5$ atoms/$cm^2$ and at an energy between 20–30 KeV.

Figure 28:
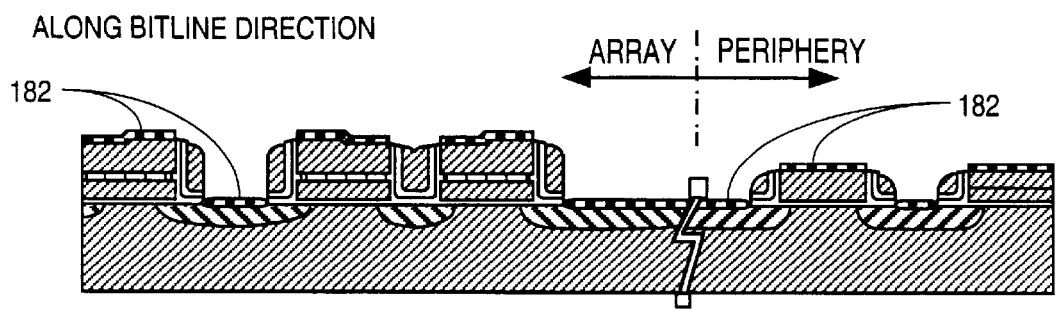
FIG. 28 is an illustration of a cross-sectional view taken along the bitline direction showing the formation of a silicide from the substrate of FIG. 27.

Next, as shown in FIG. 28, (along the bit line direction) substrate 100 is heated to a temperature sufficient to cause metal film 180 to react with silicon to form a metal silicide. Metal silicide forms on those locations where silicon is available for reaction with the metal and is indirect contact with the metal. As such, metal silicide 182 forms on the top of polysilicon control gates, on the drain regions 166, and on the source rail contact regions (not shown) as well as on the source/drain regions and on the gate of MOS devices in the periphery of integrated circuit and polysilicon interconnects. Metal film 180 remains unreacted over areas where there is no silicon available for reaction such as dielectric layers, including sidewall spacers 176, silicon nitride plug 178, and shallow trench isolation regions 124. In a preferred embodiment of the present invention, silicide 182 formed is low resistance titanium silicide (TixSiy) preferably in the C-54 phase. Any suitable heating or annealing process can be used to form metal silicide 182 including a furnace anneal or a rapid thermal anneal.

Next, as also shown in FIG. 28, unreacted metal is etched away with an etchant which selectively removes the unreactive metal but does not remove the formed metal silicide 182. A wet etchant comprising H2O2/NH4OH/H2O can be utilized to selectively remove the titanium metal without etching the titanium silicide.

Figure 29:
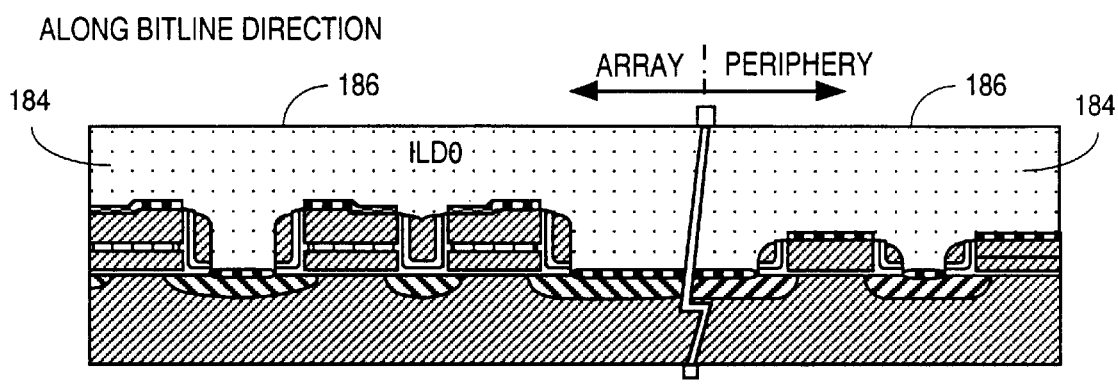
FIG. 29 is an illustration of a cross-sectional view taken along the bitline direction showing the formation of a planar interlayer dielectric over the substrate of FIG. 28.

Next, as illustrated in FIG. 29, (along the bit line direction), and interlayer dieletric 184 is blanket deposited over substrate 100. Interlayer dielectric 184 can be any suitable dielectric such as silicon dioxide and can be a composite dielectric comprising a plurality of different deposited dielectrics. Next, as also shown in FIG. 26, interlayer dielectric 184 is planarized by chemical mechanical polishing to form a planar top surface 186. ILD layer 184 should be deposited to a thickness sufficient to enable a sufficient amount of dieletric to be removed so that a sufficiently planar top surface 184 can be achieved while still leaving a sufficient amount of dielectric, for example between 3500–4500 Å of interdielectric, above the highest features (e.g., silicon flash cells) to sufficiently isolate the features from a subsequently formed metal line on planar surface 186.

Figure 30:
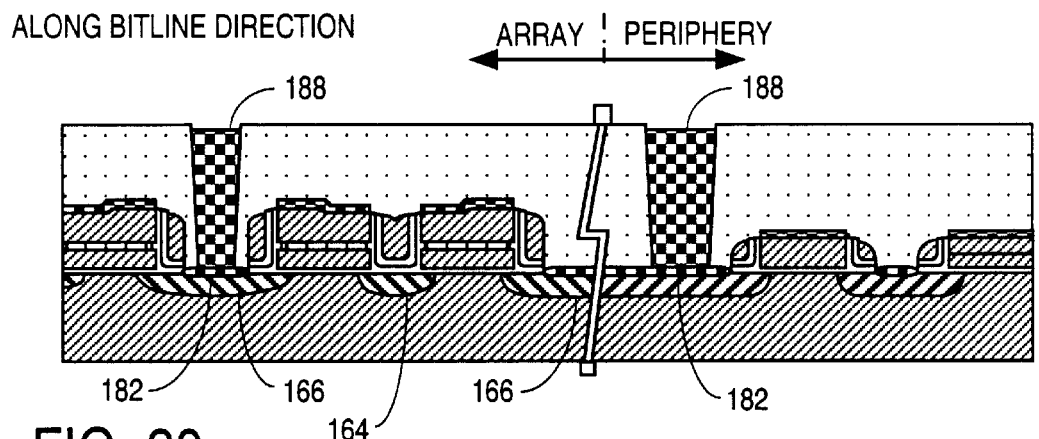
FIG. 30 is an illustration of a cross-sectional view taken along the bitline direction showing the formation of electrical contacts in the substrate of FIG. 29.

Next, electrical contacts 188 are formed through interlayer dielectric 184 as shown in FIG. 30, (taken along the bit line direction). In the present invention electrical contact 188 are formed to each of the shared drain regions, to each of the control gates, and to each source rail contact area, as well as to source/drain regions and gates of the pMOS and nMOS devices in the peripherial integrated circuit. In the present invention all contacts 188 are made to low resistance silicide regions 182. Contacts 188 can be formed by any well known techniques. In an embodiment of the present invention contacts 188 are formed by forming a photoresist mask over interlayer dielectric 184 which defines locations where contacts 188 are desired. Using the mask via holes are then etched through the interlayer dielectric 184 down to the silicide regions 182. An etchant which preferentially etches interlayer dielectric 184 but which does not etch silicide 182 is preferably used. The mask is then removed and a barrier layer such as but not limited to titanium/titanium nitride is blanket deposited over the interlayer dielectric and into the via openings. Next, a tungsten film can be blanket deposited by chemical vapor deposition over the barrier layer and into the formed via openings. The tungsten film is formed to a thickness which completely fills the via openings. The tungsten film and the barrier layers can then be chemically mechanically polished back to remove the films from the top surface of interlayer dielectric thereby form Ti/TiN/W contacts 188.

Figure 31:
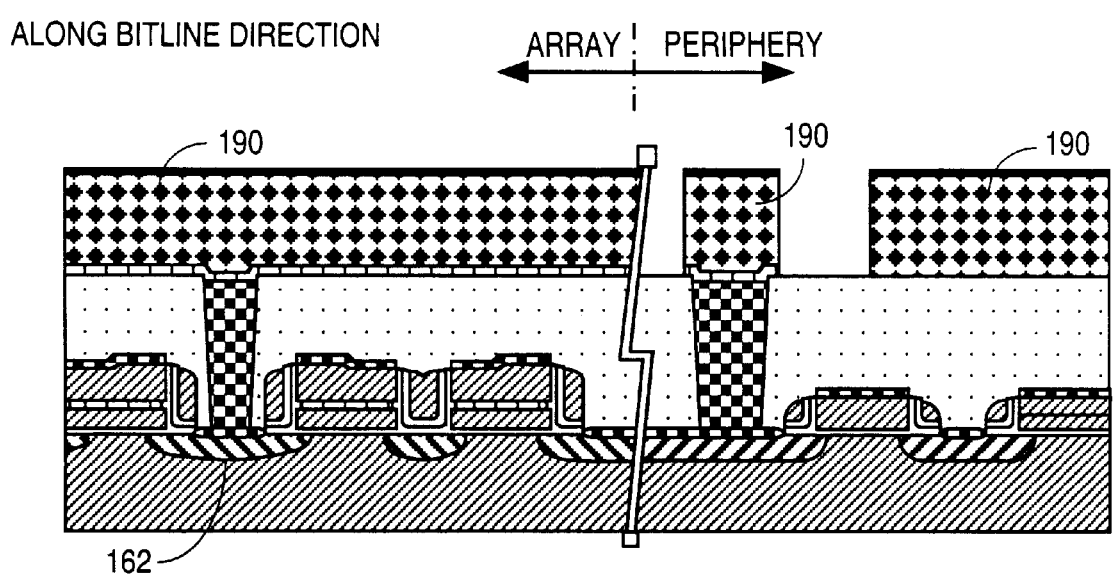
FIG. 31 is an illustration of a cross-sectional view taken along the bitline direction showing the formation and patterning of a first level of metallization on the substrate of FIG. 30.

Next, as shown in FIG. 31, taken along the bit line direction a first level of metallization such as aluminum is blanket deposited by any well known technique such as sputtering over the planar surface of ILD 184. Metal film 190 may or may not include barrier layer such as titanium and/or a capping layer such as titanium/titanium nitride if desired. Next, the metal film is patterned using well known photolithography and etching techniques as shown in FIG. 31.

Patterned metal 1 can be used to form bit lines in the array portion which contact the shared drains through contact 188 as shown in FIG. 31. The back end processing techniques illustrated in FIGS. 29, 30 and 31 can be continued to add as many levels of metallization as desired to interconnect the various devices and memory cells fabricated on substrate 100. After the last level of metallization is formed and patterned well known passivation films are formed in order to hermetically seal the integrated circuit. At this point the fabrication of a flash integrated circuit in accordance with the present invention is complete.

Thus, a novel flash integrated circuit and its method of fabrication has been described.

We claim:

1. A method of forming a doped source region comprising:

forming a dielectric in a trench in a silicon substrate to form a dielectric filled trench isolation region, said dielectric filled trench isolation region isolating a first portion of said silicon substrate from a second portion of said silicon substrate;

removing a portion of said dielectric in said trench to reveal a portion of said silicon substrate in said trench between said first and said second portions of said silicon substrate; and implanting ions to form a first doped source region in said first portion of said silicon substrate, to form a second doped source region in said second portion of the said silicon substrate and to form a doped region in said revealed silicon substrate in said trench, said doped region in said trench extending from said first doped source region to said second doped source region.

2. The method of 1 wherein said dielectric film trench isolation regions have sidewalls tapered at an angle between 80–60° from the surface of said silicon substrate.

3. The method of 1 wherein ions are implanted perpendicular to the surface of said silicon substrate.

* * * * *